(12) United States Patent
Huang

(10) Patent No.: US 11,316,060 B2
(45) Date of Patent: Apr. 26, 2022

(54) SOLAR MODULE

(71) Applicant: HELIARTEC SOLUTIONS CORPORATION, LTD., Zhubei (TW)

(72) Inventor: Ting-Hui Huang, Zhubei (TW)

(73) Assignee: HELIARTEC SOLUTIONS CORPORATION, LTD.

( * ) Notice: Subject to any disclaimer, the term of this patent is extended or adjusted under 35 U.S.C. 154(b) by 0 days.

(21) Appl. No.: 15/791,938

(22) Filed: Oct. 24, 2017

(65) Prior Publication Data
US 2019/0027628 A1    Jan. 24, 2019

(30) Foreign Application Priority Data
Jul. 19, 2017   (TW) ................... 106124108

(51) Int. Cl.
*H01L 31/054*       (2014.01)
*H01L 31/048*       (2014.01)
*H02S 40/20*        (2014.01)

(52) U.S. Cl.
CPC ...... *H01L 31/0543* (2014.12); *H01L 31/0481* (2013.01); *H01L 31/0488* (2013.01); *H02S 40/20* (2014.12); *Y02E 10/50* (2013.01)

(58) Field of Classification Search
CPC .. H01L 31/0543; H01L 31/0488; H02S 40/20
See application file for complete search history.

(56) References Cited

U.S. PATENT DOCUMENTS

| | | | | |
|---|---|---|---|---|
| 6,384,318 | B1* | 5/2002 | Nomura | H01L 31/0236 136/246 |
| 2010/0147364 | A1* | 6/2010 | Gonzalez | H01L 31/02021 136/251 |
| 2011/0308606 | A1* | 12/2011 | Hsieh | H01L 31/0392 136/258 |
| 2012/0152323 | A1* | 6/2012 | Perry | B32B 27/08 136/251 |
| 2012/0247558 | A1* | 10/2012 | Hsu | H01L 31/02168 136/259 |

* cited by examiner

*Primary Examiner* — Tae-Sik Kang
(74) *Attorney, Agent, or Firm* — Behmke Innovation Group LLC; James M. Behmke; Jonathon P. Western

(57) ABSTRACT

The present disclosure provides a solar module including an encapsulating layer, solar cells embedded in the encapsulating layer, and a patterned layer formed on the encapsulating layer. The pattered layer includes at least one patterned unit having a plurality of color spots separated from one another, thereby allowing light incident on the color spots to be diffracted through adjacent gaps, so as to produce Poisson spots on the solar cells at locations corresponding to the color spots.

7 Claims, 2 Drawing Sheets

SOLAR MODULE

RELATED APPLICATION

This application claims the benefit of Taiwanese Patent Application No. 106124108, filed on Jul. 19, 2017, the entire content of which is incorporated herein.

BACKGROUND

1. Technical Field

The present disclosure relates to solar cells, and, more particularly, to a solar module.

2. Description of Related Art

Modern solar modules are capable of showing images and colors by screen printing ink or glaze coating on the cover glass.

As shown in FIG. 1, a conventional solar module 1 may include an encapsulating layer 10, a plurality of solar cells 13 embedded in the encapsulating layer 10, a first translucent sheet 11 and a second translucent sheet 12 laminated above and below the encapsulating layer 10, respectively, and a patterned layer 14 formed between the first translucent sheet 11 and the encapsulating layer 10.

In the conventional solar module 1, the patterned layer 14 includes a plurality of patterned units 14a that are too large and do not have any gaps within themselves. This makes it impossible for light to pass through the patterned units 14a. As such, solar cells 13 at locations corresponding to the patterned units 14a are sheltered from sunlight, resulting in leakage of the solar cells 13 and creation of hot zones H. This also lowers the power generation conversion rate of the solar cells 13 or even creates hot spots in the solar module 1. Hot spots may cause the solar module 1 to rupture or even burst into flames.

Furthermore, in the conventional solar module 1, the top and bottom surfaces of the first translucent sheet 11 are generally smooth (with a roughness Ra less than about 0.01), which tends to cause total reflection of light and reduces the light incident on the solar cells.

Therefore, there is a need for a solution that addresses the aforementioned issues in the prior art.

SUMMARY

In view of the aforementioned shortcomings of the prior art, the present disclosure provides a solar module, which may include: an encapsulating layer including a first surface and a second surface opposite to the first surface; a plurality of solar cells embedded in the encapsulating layer; and a patterned layer formed on the first surface of the encapsulating layer and including at least one patterned unit having a plurality of color spots separate from one another.

In an embodiment, the width of the color spots is between 0.03 and 0.10 mm, preferably, between 0.05 and 0.08 mm.

In an embodiment, the solar module may further include a first translucent sheet that is combined to the first surface of the encapsulating layer and the patterned layer. For example, the first translucent sheet can be a glass sheet. The first translucent sheet may include a light-facing surface and a backlit surface opposing the light-facing surface and combined with the encapsulating layer and the patterned layer. The light-facing surface of the first translucent sheet may be formed with a rough face, or the light-facing surface and the backlit surface may both be formed with rough faces. In an embodiment, the roughness Ra of the rough faces is greater than 0.1.

In an embodiment, the solar module may further include a second translucent sheet that is combined to the second surface of the encapsulating layer. For example, the second translucent sheet can be a glass sheet.

As can be understood from the above, in the solar module according to the present disclosure, the patterned units include a plurality of separated color spots, which allow light to be diffracted through the gaps adjacent to the color spots, and thus form Poisson spots on the solar cells at locations corresponding to the color spots. Therefore, as compared to the prior art, the present disclosure has no sheltered areas formed on the solar cells at locations corresponding to the patterned units, thereby preventing leakage and hot zones from occurring. Further, as no hot spots are created, the solar module is prevented from rupture or catching fire.

BRIEF DESCRIPTION OF THE DRAWINGS

The present disclosure can be more fully understood by reading the following detailed description of the embodiments, with reference made to the accompanying drawings, wherein.

DETAILED DESCRIPTION OF THE EMBODIMENTS

Figure 1:
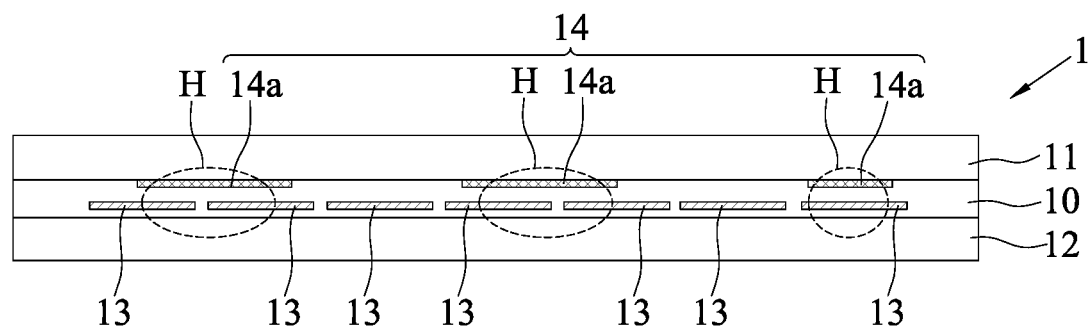
FIG. 1 is a cross-sectional diagram depicting a conventional solar module.

The present disclosure is described by the following specific embodiments. Those with ordinary skills in the arts can readily understand other advantages and functions of the present disclosure after reading the disclosure of this specification. The present disclosure may also be practiced or applied with other different implementations. Based on different contexts and applications, the various details in this specification can be modified and changed without departing from the spirit of the present disclosure.

It should be noted that the structures, ratios, sizes shown in the drawings appended to this specification are to be construed in conjunction with the disclosure of this specification in order to facilitate understanding of those skilled in the art. They are not meant, in any ways, to limit the implementations of the present disclosure, and therefore have no substantial technical meaning. Without affecting the effects created and objectives achieved by the present disclosure, any modifications, changes or adjustments to the structures, ratio relationships or sizes, are to be construed as fall within the range covered by the technical contents disclosed herein. Meanwhile, terms, such as "above", "one", "a", "an", and the like, are for illustrative purposes only, and are not meant to limit the range implementable by the present disclosure. Any changes or adjustments made to their relative relationships, without modifying the substantial technical contents, are also to be construed as within the range implementable by the present disclosure.

Figure 2:
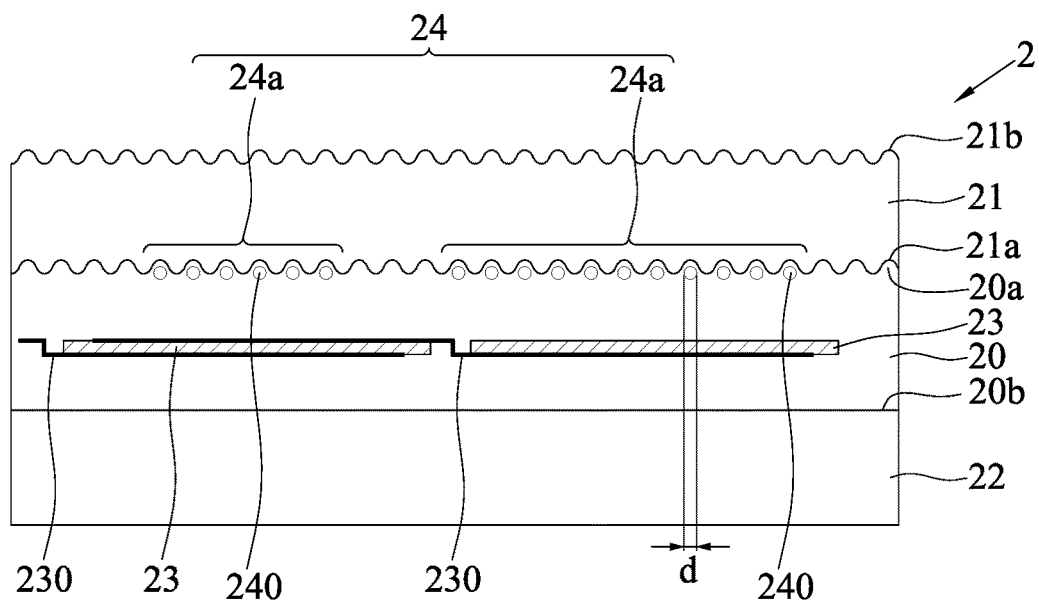
FIG. 2 is a cross-sectional diagram depicting a solar module in accordance with an embodiment of the present disclosure.

FIG. 2 is a cross-sectional diagram depicting a solar module 2 in accordance with an embodiment of the present disclosure. The solar module 2 includes: an encapsulating layer 20, a first translucent sheet 21, a second translucent sheet 22, a plurality of solar cells 23 and a patterned layer 24.

The encapsulating layer 20 includes a first surface 20a and a second surface 20b opposite to the first surface 20a.

In an embodiment, the encapsulating layer 20 is made of, but not limited to, ethylene vinyl acetate (EVA), polyvinyl butyral (PVB) or polyolefin (PO).

The solar cells 23 are embedded in the encapsulating layer 20, and electrically connected in series through soldering of a plurality of circuits 230. The circuits 230 are made of conductive copper foil (or so called "ribbon").

The patterned layer 24 is formed on the first surface 20a of the encapsulating layer 20, and includes a plurality of patterned units 24a that include a plurality of separated color spots 240.

In an embodiment, the patterned layer 24 is made of glaze pigments. The width d of a single color spot 240 is between 0.03 and 0.10 mm, and can be selected as to be between 0.05 and 0.08 mm; and preferably 0.05 mm. A plurality of separated color spots 240 constitute a single patterned unit 24a.

The first translucent sheet 21 is combined on top of the first surface 20a of the encapsulating layer 20 and the patterned layer 24.

In an embodiment, the first translucent sheet 21 is a glass sheet, and rough surfaces 21a and 21b are formed on the two opposite surfaces (a light-facing surface and a backlit surface) of the first translucent sheet 21. The roughness Ra of the rough surfaces 21a and 21b are greater than 0.1. In an embodiment, the first translucent sheet 21 is roughened using a chemical etching process, for example, by spraying a diluted hydrofluoric solution directly on the glass, and then rinsing it off. As such, the roughness Ra is controlled to be greater than 0.1.

In another embodiment, the first translucent sheet 21 is combined with the first surface 20a of the encapsulating layer 20 and the patterned layer 24 via its rough surface 21a.

Further, the entire areas of the rough surfaces 21a and 21b of the first translucent sheet 21 can be selected to be roughened, or a portion of the rough surfaces 21a and 21b of the first translucent sheet 21 is roughened as needed.

The second translucent sheet 22 is a glass sheet and is combined on the second surface 20b of the encapsulating layer 20.

The manufacturing process of the solar module 2 in accordance with the present disclosure includes the following steps. First, the first translucent sheet 21 is roughened using an etchant, and then the etchant is rinsed off with water. After the first translucent sheet 21 is dry, glaze is formed on a lower rough surface 21a of the first translucent sheet 21 by transfer or spraying to form a patterned layer 24 with color spots 240. The glaze is then sintered at a temperature of at least 500° C. Thereafter, an encapsulant is formed between the lower rough surface 21a of the first translucent sheet 21 and the patterned layer 24 and a second translucent sheet 22. The encapsulant encapsulates solar cells 23 that are connected in series. Finally, the encapsulant is thermoset to form an encapsulating layer 20, thereby completing the manufacturing of the solar module 2.

Figure 3:
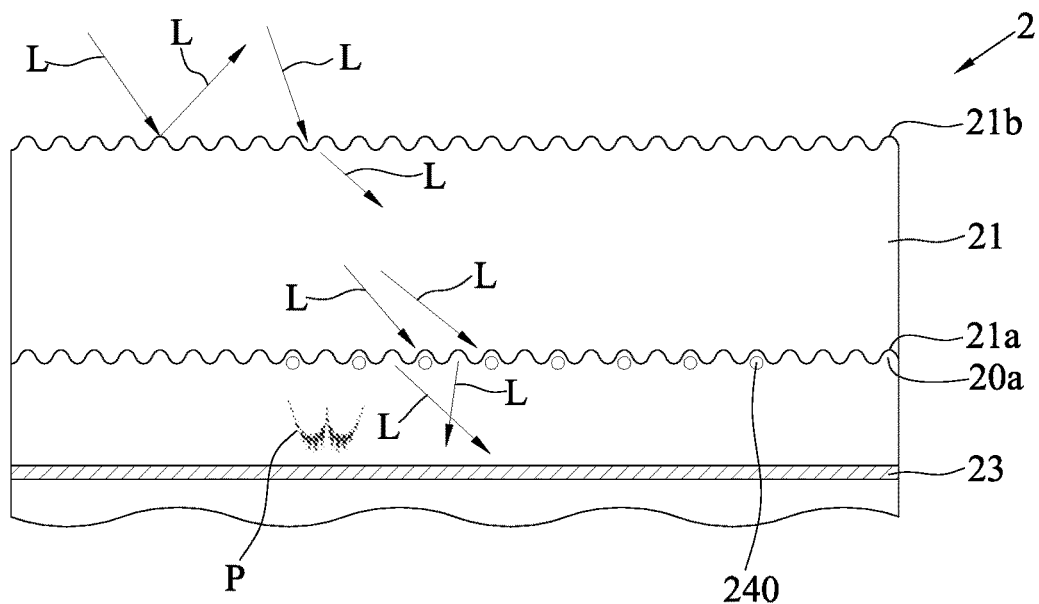
FIG. 3 is a cross-sectional diagram depicting the solar module in accordance with an embodiment of the present disclosure in use.

During use of the solar module 2 according to the present disclosure, as shown in FIG. 3, under sunshine, as the first translucent sheet 21 is surface roughened and combined with size-controlled color spots, incident light can enter the solar module 2 at different angles, and light rays L incident on the color spots 240 are diffracted through adjacent gaps, and integral effects P of Poisson spots of different forms and at different locations can be created on the solar cells 23 at locations corresponding to the color spots 240. In other words, a small amount of light L is incident on the solar cells 23 directly underneath the color spots 240. Therefore, compared to the prior art, there is no sheltered areas formed on the solar cells 23 at locations corresponding to the patterned units 24a, thus preventing leakage and hot zones from occurring. Further, no hot spots are created, which prevents the solar module 2 from rupture or catching fire.

Furthermore, the solar module 2 according to the present disclosure includes rough surfaces 21a and 21b on the first translucent sheet 21, which reduces the proportion of total reflection, increasing the power generation conversion rate of the solar cells 23.

Moreover, the glass material of the first translucent sheet 21 includes rough surfaces 21a and 21b obtained through surface roughening, such that incident light L are allowed to enter at many different angles, so that integral effects of Poisson spots of different forms and at different locations are created underneath the color spots 240, preventing local sheltered areas being formed on the solar cells 23.

In addition, since the solar module 2 according to the present disclosure utilizes the principle of integral effects of Poisson spots, if the roughness Ra of the first translucent sheet 21 is greater than 0.25, only the light-facing surface (i.e., the upper rough surface 21b) of the first translucent sheet 21 needs to be roughened. Meanwhile, the first translucent sheet 21 may be in contact with the patterned layer 24 and the first surface 20a of the encapsulating layer 20 via a smooth surface.

In summary, the solar module 2 according the present disclosure includes patterned units 24a having a plurality of separated color spots 240 to allow light to pass through the patterned units 24a, thereby preventing the occurrence of leakage and hot zones. In addition, with the surface-roughened first translucent sheet 21, the power generation conversion rate of the solar cells 23 can be enhanced, while resolving conflicts between image coloring and power generation conversion rate.

The above embodiments are only used to illustrate the principles of the present disclosure, and should not be construed as to limit the present disclosure in any way. The above embodiments can be modified by those with ordinary skill in the art without departing from the scope of the present disclosure as defined in the following appended claims.

What is claimed is:

1. A solar module, comprising:
   an encapsulating layer including a first surface, a second surface opposite to the first surface, and side surfaces adjacent to the first surface and the second surface;
   a plurality of solar cells embedded in the encapsulating layer;
   a patterned layer made of glaze pigments formed on a part of the first surface of the encapsulating layer and including at least one patterned unit having a plurality of color spots separated from one another, wherein the patterned layer of the glaze pigments is free from being formed on an entirety of the first surface of the encapsulating layer, and Poisson spots are created underneath the color spots;
   a first translucent sheet combined to the first surface of the encapsulating layer and the patterned layer, wherein a light-facing surface of the first translucent sheet is formed with a first rough face and a backlit surface of the first translucent sheet is formed with a second rough face wherein the second rough face of the backlit surface is in direct contact with the encapsulating layer and the patterned layer, and wherein the first rough face and the second rough face allow light to enter the patterned layer at different angles; and a second translucent sheet combined to the second surface of the encapsulating layer.

2. The solar module of claim 1, wherein at least one of the color spots is between 0.03 mm and 0.10 mm in width.

3. The solar module of claim 1, wherein at least one of the color spots is between 0.05 mm and 0.08 mm in width.

4. The solar module of claim 1, wherein the first rough face is formed on at least a portion of the light-facing surface and the second rough face is formed on at least a portion of the backlit surface.

5. The solar module of claim 1, wherein the first rough face is formed on an entire area of the light-facing surface and the second rough face is formed on an entire area of the backlit surface.

6. The solar module of claim 1, wherein the Poisson spots are created underneath the color spots for the light to reach the solar cells sheltered by the color spots.

7. The solar module of claim 1, wherein the solar cells are connected in series.

* * * * *